(12) United States Patent
Mizuno et al.

(10) Patent No.: US 6,348,238 B1
(45) Date of Patent: Feb. 19, 2002

(54) THIN FILM FABRICATION METHOD AND THIN FILM FABRICATION APPARATUS

(75) Inventors: Shigeru Mizuno, Tokyo; Makoto Satou, Yamanashi-ken; Manabu Tagami; Hideki Satou, both of Tokyo, all of (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/453,883

(22) Filed: Feb. 15, 2000

(30) Foreign Application Priority Data

Mar. 12, 1999 (JP) .......................................... 11-066067

(51) Int. Cl.[7] .......................... C23C 14/32; C23C 14/00
(52) U.S. Cl. ....................... 427/524; 427/523; 427/569; 427/570; 204/192.3
(58) Field of Search ................................ 427/523, 524, 427/569, 570; 204/192.12, 192.3

(56) References Cited

U.S. PATENT DOCUMENTS

| | | | |
|---|---|---|---|
| 4,692,230 A | * 9/1987 | Nihei et al. | 204/192.12 |
| 4,963,239 A | 10/1990 | Shimamura et al. | |
| 5,178,739 A | 1/1993 | Barnes et al. | |
| 5,300,205 A | * 4/1994 | Fritsche | 204/192.12 |
| 5,310,452 A | * 5/1994 | Doki et al. | 427/570 |
| 5,472,508 A | * 12/1995 | Saxena | 118/723 E |
| 5,651,865 A | 7/1997 | Sellers | |
| 5,693,417 A | * 12/1997 | Goedicke et al. | 204/192.15 |
| 5,723,386 A | * 3/1998 | Ishikawa | 427/575 |
| 5,770,023 A | * 6/1998 | Seilers | 204/192.3 |
| 5,928,528 A | * 7/1999 | Kubota et al. | 427/569 |
| 5,983,828 A | * 11/1999 | Savas | 427/569 |
| 6,051,114 A | * 4/2000 | Yao et al. | 204/192.3 |
| 6,051,321 A | * 4/2000 | Lee et al. | 427/578 |
| 6,068,784 A | * 5/2000 | Collins et al. | 216/68 |

FOREIGN PATENT DOCUMENTS

| | | |
|---|---|---|
| JP | 59-18625 | 1/1984 |
| JP | 1-184276 | 7/1989 |
| JP | 1-195271 | 8/1989 |
| JP | 1-195272 | 8/1989 |
| JP | 1-195273 | 8/1989 |
| JP | 2-138456 | 5/1990 |
| JP | 6-41739 | 2/1994 |
| JP | 6-220627 | 8/1994 |
| JP | 8-16266 | 2/1996 |
| JP | 8-41636 | 2/1996 |
| JP | 10-324969 | 12/1998 |

OTHER PUBLICATIONS

Metal ion deposition from ionized mangetron sputtering discharge; S.M. Rossnagel et al.;*J. Vac. Sci. Technol. B* 12(1), Jan./Feb. 1994; pp. 449–453.

(List continued on next page.)

*Primary Examiner*—Marianne Padgett
(74) *Attorney, Agent, or Firm*—Burns, Doane, Swecker & Mathis, LLP

(57) ABSTRACT

A thin film is fabricated while causing ions in a plasma P to be incident by effecting biasing relative to the space potential of the plasma P by imparting a set potential to the surface of a substrate 9. A bias system 6 causes the substrate surface potential Vs to vary in pulse form by imposing an electrode imposed voltage Ve in pulse form on a bias electrode 23 which is in a dielectric block 22. The pulse frequency is lower than the oscillation frequency of ions in the plasma P, and the pulse period T, pulse width t and pulse height h are controlled by a control section 62 in a manner such that the incidence of ions is optimized. The imposed pulses are controlled in a manner such that the substrate surface potential Vs recovers to a floating potential Vf at the end of a pulse period T, and that the ion incidence energy temporarily crosses a thin film sputtering threshold value in a pulse period T.

14 Claims, 10 Drawing Sheets

OTHER PUBLICATIONS

Magnetron sputter deposition with high levels of metal ionization; S. M. Rossnagel et al.; Appl. Phys. Lett. 63 (24), Dec. 13, 1999; pp. 3285–3287.

Advanced Metalization and Interconnect Systems for ULSI Applications in 1196; Oct. 23–24, 1996; pp. 139–143. Pictures from an Oral Presenation, Hosoda et al.

Ionized Magnetron Sputtering for Lining and Filling Trenches and Vias; S.M. Rossnagel; *Semiconductor International;* Feb. 1996; pp. 99–102.

Magnetron Sputter Deposition for Interconnect Applications; S.M. Rossnagel; 1996 Materials Research Society; pp. 227–232. Conference Proceedings (No Month).

*Glow Discharge Processes;* Brian Chapman; John Wiley & Sons, Inc. 1980; pp. 142–147 and pp. 72 and 73. (No Month).

* cited by examiner

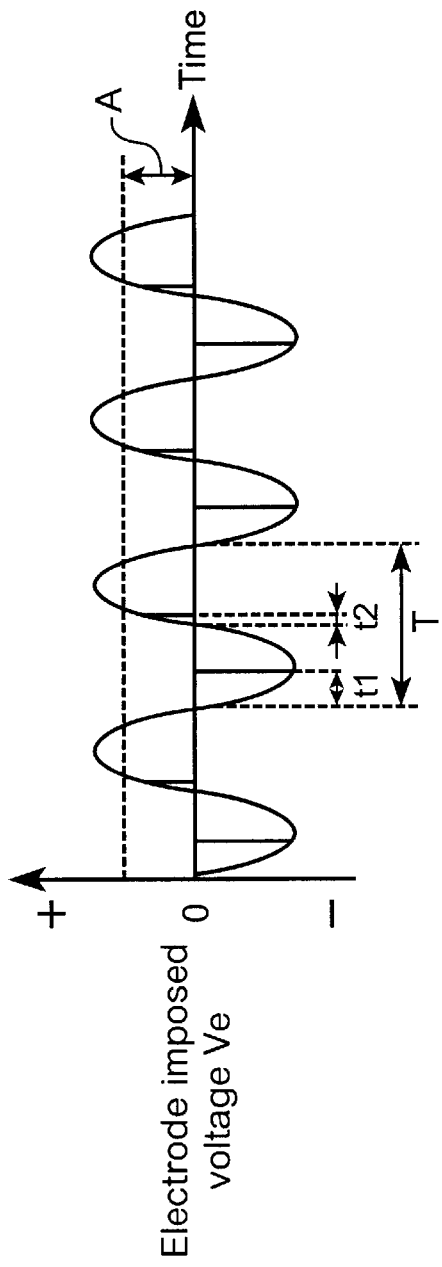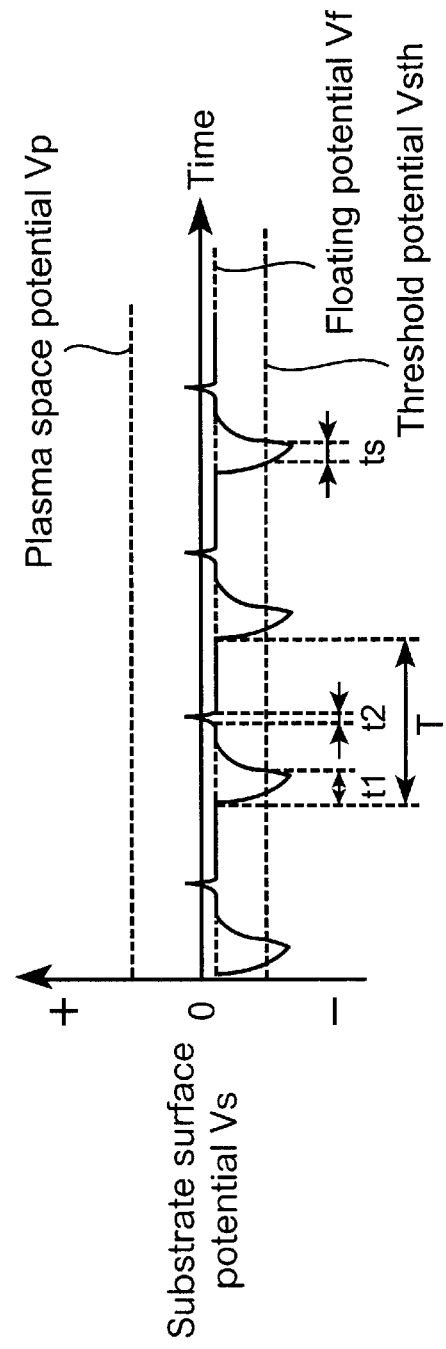

THIN FILM FABRICATION METHOD AND THIN FILM FABRICATION APPARATUS

CROSS-REFERENCE TO RELATED APPLICATIONS

Referenced-applications

This application claims the priority of Japanese Patent Application No. 11-066067, filed on Mar. 12, 1999 in Japan, the entire contents of which are hereby incorporated herein by reference.

STATEMENT REGARDING FEDERALLY SPONSORED RESEARCH

Not Applicable

REFERENCE TO A MICROFICHE APPENDIX

Not Applicable

BACKGROUND OF THE INVENTION

1. Description of Related Art

Thin film fabrication processes such as sputtering and CVD are widely employed in the manufacture of LSI and various other electronic devices and display devices such as liquid crystal displays, etc. Meanwhile, greater and greater advances are being made in device integration and miniaturization in the field of semiconductor devices. Device miniaturization demands new techniques in device manufacture. More specifically, aspects involved comprise the filling of very fine holes with sufficient amounts of film, measures to reduce step differences in device manufacture, and the prevention of lead breakage due to electron migration or the production of heat caused by high current density. In particular, technology by which a barrier film with sufficient thickness is formed with good coverage in the bottom of a fine hole with a high aspect ratio (the ratio of the hole depth to the diameter or width of the hole's opening) is a technology which holds the key to future semiconductor device manufacture.

A barrier film is used for the purpose of preventing mutual attack and diffusion of underlying material and wiring material (ensuring a barrier characteristic) and also for the purpose of ensuring electrical conductivity and ensuring close adhesion. Laminate films consisting of titanium films and titanium oxide films, tantalum films, tantalum oxide films and laminate films consisting of tantalum films and tantalum oxide films, etc. are used as barrier films.

There is currently interest in the plasma CVD procedure and ionizing sputtering procedure, etc. in which a film is deposited while imposing a bias on a substrate as procedures for forming a barrier film on the inner surface of a fine hole which has a high aspect ratio. FIG. 9 will be used to describe an ionizing sputtering procedure as one example of conventional procedures. FIG. 9 is a front view which schematically shows the structure of an ionizing sputtering apparatus constituting one example of a conventional thin film fabrication apparatus.

The apparatus shown in FIG. 9 comprises a processing chamber 1 whose interior is pumped out by a vacuum pump system 11, a substrate holder 2 which holds a substrate 9 in a set position in the processing chamber 1, a gas delivery system 3 which introduces a set process gas into the processing chamber 1, and a plasma generation means which produces a plasma in the processing chamber 1. The plasma generation means consists principally of a cathode 4 with a target 41 installed such that the surface which is to be sputtered is exposed in the processing chamber 1, and a sputter power supply 5 which causes a plasma to be produced by imposing a set voltage on the target 41 and causing sputtering discharge to be produced.

A source which imposes a high-frequency voltage with a frequency of about 13.56 MHz on the target 41 is used as the sputter power supply 5. When a set process gas is introduced into the processing chamber 1 by the gas delivery system 3 and a high-frequency voltage is imposed on the target 41 by the sputter power supply 5, high-frequency discharge occurs in the process gas, and a plasma is produced. A capacitance for which a matching unit (not shown) is used is present between the sputter power supply 5 and the target 41 surface which is to be sputtered. On imposition of the high-frequency voltage via the capacitance, electrons and ions in the plasma act in charging and discharging of the capacitance, and, because of the difference between the mobility of electrons and that of ions, a self-bias voltage is produced in the target 41. The self-bias voltage is a negative direct-current voltage which is superimposed on the high-frequency voltage. Because of this self-bias voltage, ions are drawn out from the plasma and strike the target 41. As a result, the target 41 is sputtered.

Particles (which are normally in an atomic state, and are referred to below as sputter particles or sputter atoms) which are ejected from the target 41 by sputtering fly through the interior of the processing chamber 1 and reach the surface of the substrate 9. Arrival of a lot of sputter particles results in the growth of a thin film. When sputtering is effected for a set time, a thin film with a set thickness is produced on the surface of the substrate 9.

The sputter power supply 5 also serves as an ionization means which ionizes sputter particles which are ejected from the target 41 through sputtering. When a high-frequency power supply such as noted above is used as the sputter power supply 5, electrons in the plasma collide with the sputter particles, so increasing the efficiency of ionization of the sputter particles. Sometimes, a structure in which a high-frequency voltage is imposed on a high-frequency electrode which is provided partway along the flight path of the sputter particles is employed as an ionization means.

There is further provided a bias system 6 which biases the substrate 9 in order to cause ions in the plasma to strike the substrate 9. What is meant by 'bias' is that a set potential relative to the plasma's space potential is imparted to the surface of the substrate 9 in order to cause ions in the plasma to strike the substrate 9.

The substrate holder 2 comprises a holder main body 21 made of metal which is kept at ground potential, and a dielectric block 22, etc., which is fixed to the holder main body 21. A bias electrode 23 is provided inside the dielectric block 22. The bias system 6 in a conventional apparatus consists mainly of a bias power supply 61, etc. connected to the bias electrode 23.

When sputtering is effected while using the bias system 6, the action of sputter particles which have been ionized (and are referred to below as ionized sputter particles) has the effect of improving the coverage in holes. This point will now be described with reference to FIG. 10. In FIG. 10, which is a drawing for the purpose of description in relation to the surface potential of the substrate 9 in a conventional method and apparatus, FIG. 10(1) indicates the voltage imposed on the bias electrode 23, and FIG. 10(2) indicates the surface potential of the substrate 9.

First, the substrate 9 is set on the dielectric block 22 constituting part of the substrate holder 2. Therefore, the potential (referred to below as the substrate surface voltage Vs) of the substrate 9 surface which is exposed to the plasma first becomes a floating potential. The floating potential (indicated as Vf in FIG. 10(2)) is a negative potential of around several volts. The strength of the sheath field produced by the floating potential Vf depends on the plasma density. Further, the plasma density depends on the output of the high-frequency power supply which is used as the sputter power supply 5.

On the other hand, the plasma's space potential (indicated as Vp in FIG. 10(2), is a positive potential of about 0V to several volts. It is thought that the plasma space potential shifts slightly to the positive side because the system attempts to establish a balance as the result of electrons migrating to the surface of the substrate holder 2, etc. A sheath field whose potential gradually falls going toward the substrate 9 is produced between the plasma which is at a space potential Vp such as this and the substrate 9 to which the floating potential Vf is imparted. The orientation of the sheath field is normal to the substrate 9, and ionized sputter particles are accelerated by the sheath field and are incident on the substrate 9 at approximately right angles. As a result, the number of ionized sputter particles which reach as far as the bottom surface of a hole becomes large, and the rate of film deposition on the hole's bottom surface increases.

However, the situation is not that all the sputter particles ejected from the target 41 are ionized, but neutral sputter particles too arrive in considerable quantity at the substrate 9. These neutral sputter particles are not affected by the sheath field, and they are incident at a variety of angles on the substrate 9. Consequently, these sputter particles cause considerable build-up at the hole opening edge portion, and a protuberance which is called overhang is liable to be formed. If an overhang is formed, the hole's opening becomes smaller, and its apparent aspect ratio becomes higher. When the aspect ratio becomes high, the amount of the sputter particles which can penetrate into the hole falls, with the consequence that the hole bottom surface coverage deteriorates.

The power supply used for the bias power supply 61 is a high-frequency power supply with a frequency of about 13.56 MHz, for the sputter power supply 5. Therefore, in a state in which a plasma is being produced, when the bias power supply 61 is actuated, a self-bias voltage Vdc is imposed on the substrate 9, as indicated in FIG. 10(2), because of the difference between the mobility of electrons and that of ions. As a result, the state becomes one in which the field produced by the self-bias voltage Vdc is superimposed on the field produced by the floating potential Vf. Since, as noted earlier, the self-bias voltage is the voltage of a negative direct-current component, the sheath field becomes higher still, and the incidence energy of ions increases.

It is noted that, in actual situations, since the voltage (referred to below as the electrode imposed voltage Ve) which is imposed on the bias electrode 23 is a high-frequency voltage, and a field due to this high-frequency voltage exists, the substrate surface potential Vs varies sinusoidally in the manner indicated by the dotted line in FIG. 10(2). Further, the difference between the floating potential Vf and the substrate surface potential Vs constitutes the self-bias voltage Vdc.

However, the frequency of variation of the substrate surface potential Vs is 13.56 MHz, which is considerably higher than the plasma ion oscillation frequency (about 3.3 MHz in the case of an Ar plasma with a density of about $10^{10}$ ions/$cm^3$. Therefore, the high-frequency component may be ignored in cases where the behavior of ions is considered a matter of concern. That is, prior to the migration of ions following the high-frequency field, the orientation of the field changes, and so, overall, the high-frequency field does not affect the migration of the ions. Therefore, the principal fields which cause ions to migrate are the field produced by the self-bias voltage Vdc and the field produced by the floating potential Vf. Since the floating potential Vf is also a field which is produced by the difference between the mobility of electrons and that of ions, it is even possible to consider just one type, which is that of the 'self-bias voltage'. The situation in this case is that the entire direct-current component of the substrate surface Potential Vs shown in FIG. 10(2) is a self-bias voltage.

As described above, when the energy of incident ions becomes high, the incidence energy of the process gas ions exceeds the sputtering threshold value at the time of sputtering of a deposited film, and there is a possibility of resputtering of the deposited film of an overhang portion. As the result of resputtering of the overhang, reduction of the hole opening is prevented and, since the sputter particles ejected through resputtering fall into the hole, the coverage of the hole's inner surface (bottom surface and side surface) is improved.

2. Field of the Invention

The present invention relates to a method and apparatus for fabricating a set thin film on a substrate surface by a procedure such as sputtering or plasma-assisted chemical vapor deposition (plasma CVD).

BRIEF SUMMARY OF THE INVENTION

However, with conventional methods and apparatus, problems may arise. Specifically, as the result of the sheath field strength being increased in the manner described above by the imposition of a self-bias voltage, an overhang portion is resputtered by process gas ions, and coverage of a hole's inner surface can be improved. However, the ions also strike locations other than the overhang portion with high energy, and so cause resputtering of the thin film which is in the process of being built up or deposited. Consequently, the overall film deposition rate becomes slower and productivity falls.

There is also the problem that, as the result of the process gas ions being incident at high energy, process gas ions become admixed in the thin film, so causing a lowering of the quality of the thin film that is produced. Also, when the ion incidence quantity becomes large there is excessive accumulation of charge, and hence a problem of electrical damage to a device.

The present invention is one which has been devised in order to minimize or resolve such problems, and it has the technological significance that it provides a thin film fabrication method and a thin film fabrication apparatus with which, while the coverage of hole inner surfaces is improved, lowering of the film deposition rate is suppressed, and no harm is done to the quality of films which are produced or to manufactured device characteristics, etc.

In order to resolve the above problems, a structure is used in which, in a thin film fabrication method in which a plasma is formed in a space facing a surface of a substrate, the substrate surface is biased relative to the plasma space potential by imparting a set potential to the substrate surface, and the bias causes a set thin film to be produced on the substrate surface as ions in the plasma are caused to be incident on the substrate surface.

The biasing is preferably effected by imposing a voltage in pulse form on the substrate, the frequency of this voltage in pulse form is less than the oscillation frequency of the ions in the plasma, and the pulse period, pulse width and pulse height are controlled in a manner such that the quantity and energy of incidence of the ions on the substrate become optimum.

In the method described above, the waveform of the voltage in pulse form preferably contains a pulse for ion incidence and a pulse for relaxation whose polarity is different from that of the pulse for ion incidence.

In the method described above, the width of the pulse for relaxation is preferably shorter than a time which is the width of pulse for ion incidence deducted from the pulse period, and there is a time band in which neither a pulse for ion incidence nor a pulse for relaxation is imposed.

In the method described above, the pulse period, pulse width and pulse height are preferably controlled in a manner such that, in one pulse period, the incidence energy of the ions temporarily crosses a sputtering threshold value which is the lowest-limit energy value needed to effect sputtering of a thin film which is produced on the substrate surface.

In the method described above, the voltage in pulse form is preferably imposed indirectly on the substrate with the interposition of a dielectric.

In order to resolve the above problems, a structure is used in which, in a thin film fabrication apparatus which comprises a processing chamber whose interior is pumped out by a vacuum pump system, a substrate holder which holds a substrate in a set position in this processing chamber, a gas delivery system which introduces a set process gas into the processing chamber and a plasma generation means for producing a plasma in the processing chamber, and in which a set thin film is produced on the surface of a substrate held by the substrate holder. There is also provided a biasing device which causes ions in a plasma to be incident on the substrate surface by biasing the substrate surface relative to the plasma space potential by imparting a set potential to the substrate surface, and the biasing device preferably imposes a voltage in pulse form on the substrate, the frequency of this pulse being less than the oscillation frequency of the ions in the plasma. The structure further comprises a control section which controls the pulse period, pulse width and pulse height in a manner such that the quantity and energy of incidence of the ions on the substrate become optimum.

In the structure described above, the control section preferably effects control in a manner such that a voltage with a waveform which contains a pulse for ion incidence and a pulse for relaxation whose polarity is different from that of the pulse for ion incidence.

In the structure described above, the control section preferably effects control in a manner such that the width of the pulse for relaxation is shorter than a time which is the width of the pulse for ion incidence deducted from the pulse period, and there is a time band in which neither a pulse for ion incidence nor a pulse for relaxation is imposed.

In the structure described above, the control section preferably controls the pulse period, pulse width and pulse height in a manner such that, in one pulse period, the incidence energy of the ions temporarily crosses a sputtering threshold value which is the value of the lowest-limit necessary energy for effecting sputtering of a thin film which is produced on the substrate surface.

In the structure described above, a bias electrode is preferably installed facing the substrate with the interposition of a dielectric, and the biasing device imposes the voltage in pulse form on this bias electrode.

BRIEF DESCRIPTION OF THE SEVERAL VIEWS OF THE DRAWINGS

FIGS. 8(1) and 8(2) illustrate changes in the substrate surface potential which are brought about by the actions of a plasma and the electrode imposition voltage which is supplied to the bias electrode 23 by the bias system 6 shown in FIG. 7.

DETAILED DESCRIPTION OF THE INVENTION

Below, a description relating to forms of implementation of the invention of the present Application will be given. As in the description of the prior art, a description will be given taking sputtering as an example. However, other applications may be appropriate.

Figure 1:
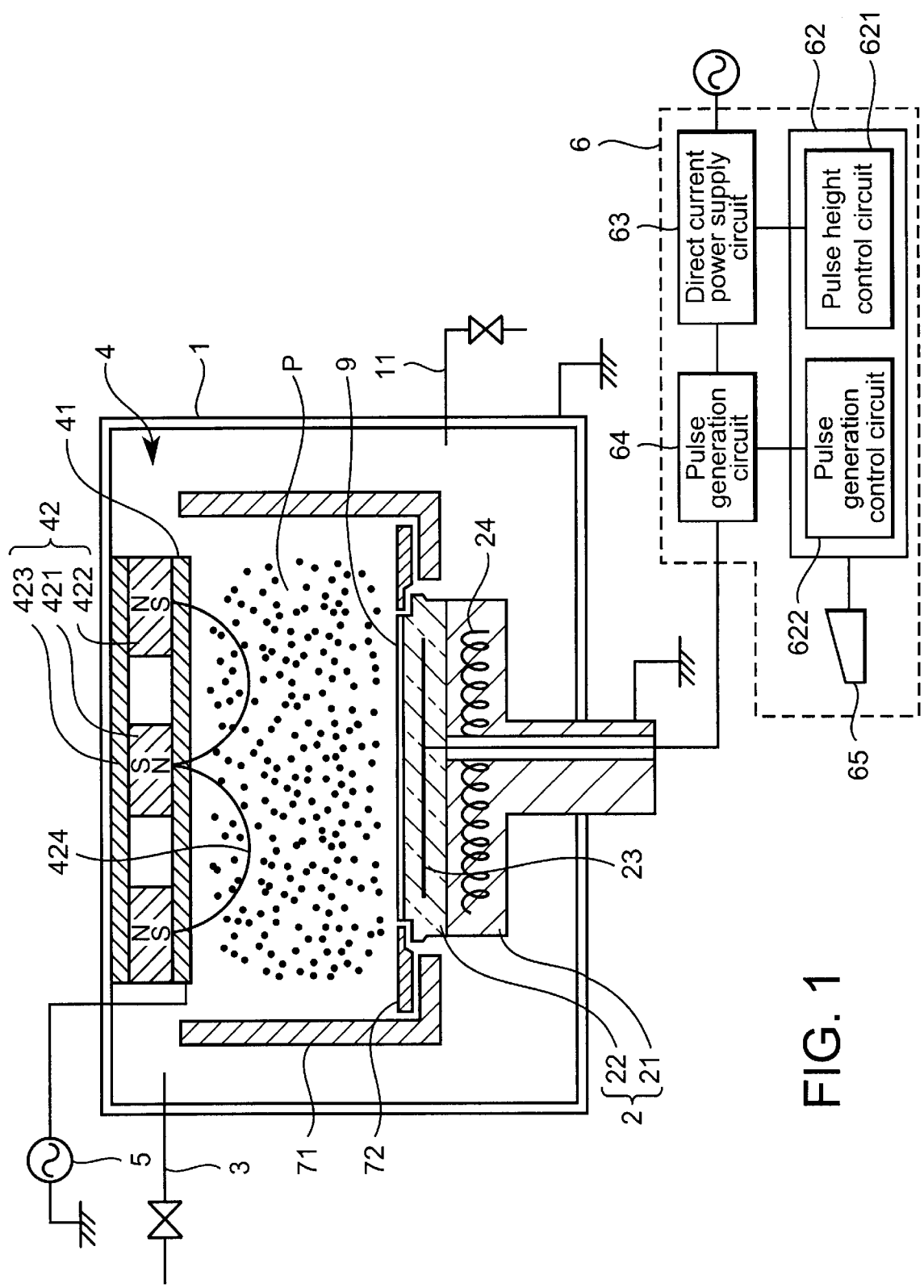
FIG. 1 is a front view which shows the outline structure of the thin film fabrication apparatus of a first embodiment of the present invention.

FIG. 1 is a front view which schematically shows the structure of a thin film fabrication apparatus in a first preferred embodiment first preferred embodiment of the present invention. The apparatus shown in FIG. 1 comprises a processing chamber 1 whose interior is pumped out by a vacuum pump system 11, a substrate holder 2 which holds a substrate 9 in a set position in the processing chamber 1, a gas delivery system 3 which introduces a set process gas into the processing chamber 1, and a plasma generation means which produces a plasma P in the processing chamber 1. The plasma generation means includes a cathode 4 with a target 41 so installed that the surface which is to be sputtered is exposed in the processing chamber 1, and a sputter power supply 5 which causes a plasma P to be produced by imposing a set voltage on the target 41 and causing sputtering discharge to be produced.

In the apparatus of this embodiment, the sputter power supply 5 is a high-frequency power supply with a frequency of about 13.56 MHz, and it serves jointly as an ionization means. There is also provided a bias system 6 which biases the surface of the substrate 9 in order to cause ions in the plasma to be incident on the substrate 9.

The apparatus of this embodiment is such that the bias system 6 effects biasing by imposing a voltage in pulse form on a bias electrode 23, and that there is provided a control section 62 which controls the imposition of this voltage in pulse form. A specific description of these points is given below.

As shown in FIG. 1, the bias system 6 in this embodiment is comprised of a direct-current power supply circuit 63 by which commercial alternating current input is converted to a set direct current, a pulse generation circuit 64 which converts the output of the direct-current power supply circuit 63 to pulse form, the control section 62, which controls the operation of the direct-current power supply circuit 63 and pulse generation circuit 64, and an input section 65 which inputs control signals to the control section 62. A bias electrode 23 is similarly provided inside a dielectric block 22 constituting part of the substrate holder 2, and the output voltage of the pulse generation circuit 64 is imposed on the bias electrode 23.

The direct-current power supply circuit 63 is a circuit in which a switching regulator system, etc. is used, and it outputs a negative direct-current voltage of a set amplitude. The pulse generation circuit 64 uses transistors to produce square wave pulses which are described below by switching.

Figure 2:
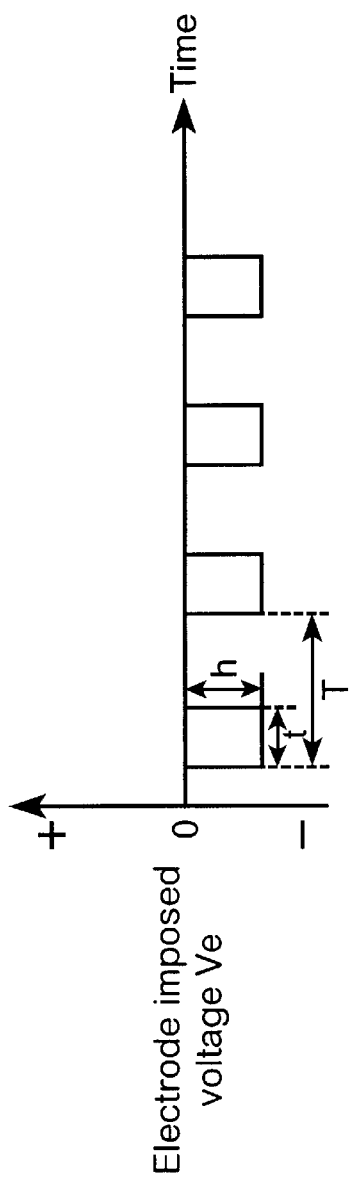
FIGS. 2(1) and 2(2) illustrate changes in the substrate surface potential which are brought about by the actions of a plasma and the electrode imposition voltage which is supplied to the bias electrode 23 by the bias system 6 shown in FIG. 1.
Figure 2:
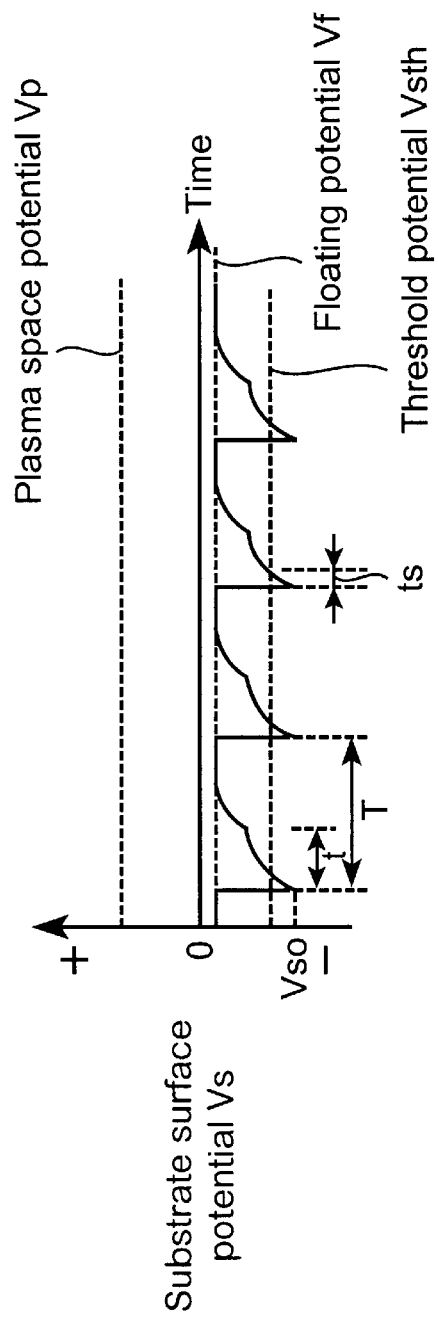

The control section 62 possesses a pulse height control circuit 621, which sends control signals to the direct-current power supply circuit 63, and a pulse generation control circuit 622, which sends control signals to the pulse generation circuit 64. FIG. 2 will be used to describe the constitution of the control section 62. In FIG. 2, which is a drawing for describing the changes in the substrate surface potential Vs which are brought about by the actions of a plasma and the voltage (electrode imposed voltage) which is imposed on the bias electrode 23 by the bias system 6, FIG. 2(1) indicates the electrode imposed voltage Ve, and FIG. 2(2) indicates the changes in the substrate surface potential Vs.

The electrode imposed voltage Ve is the output voltage of the pulse generation circuit 64. As indicated in FIG. 2(1), this voltage consists of square wave pulses which have a period T, a pulse width t and a pulse height h, and whose polarity is negative.

The pulse height control circuit 621 shown in FIG. 1 controls the output voltage of the direct-current power supply circuit 63 in accordance with values which are input from the input section 65, in order to make the pulse height h a set value. For example, the structure is made such that a control signal is sent to a reference signal generation circuit not shown in the direct-current power supply circuit 63 and the reference voltage is changed to a set value. Further, the pulse generation control circuit 622 sends control signals such as trigger signals, etc. to the pulse generation circuit 64 in accordance with values which are input from the input section 65, and controls transistor switching operations. This results in the output of square wave pulses such as described above.

Period T, pulse width t and pulse height h data are input from the input section 65. These data are set beforehand such that film deposition on the surface of the substrate 9 is optimum. A description relating to this point will now be given.

In the selection of these data, it is preferable that the period T is set in a manner such that the pulse frequency becomes lower than the oscillation frequency of ions in a plasma. In the case, for example, of an Ar plasma with a density of 1010 ions/cm–3, the ion oscillation frequency is 3.3 MHz, as noted earlier. The frequency of the electrode imposed voltage Ve indicated in FIG. 2(1) is made lower than this, e.g. 5 KHz–3 MHz. In terms of the period, this is about 0.3 p seconds–200° seconds.

Since the frequency of the electrode imposed voltage Ve is considerably higher than the ion oscillation frequency, it has been regarded as not having an effect on the behavior of the ions in the plasma and has been ignored in the past. However, in this embodiment it cannot be ignored, since it is lower than the ion oscillation frequency. That is, the migration of ions caused by the electrode imposed voltage Ve in pulse form has an effect on the substrate surface potential Vs.

To describe things in more detail, when the electrode imposed voltage Ve pulses are on and the potential of the bias electrode 23 becomes negative, a negative potential is induced at the surface of the substrate 9 via the capacitance of the dielectric block 22, as indicated in FIG. 2(2). Ions in the plasma are drawn to the surface of the substrate 9 by this potential and strike the surface. Therefore, the incident ions cause the substrate surface potential Vs to gradually rise in the manner indicated in FIG. 2(2).

Then, when the electrode imposed voltage Ve pulses are turned off, the rise of Vs stops at this point. Since the substrate surface potential Vs at this time becomes lower than the floating potential Vf, which is present as a background, the rise continues even after the pulses have been turned off, but it stops when the floating potential Vf is reached. In other words, the floating potential Vf is the potential at which the incidence of ions and electrons on the surface reaches equilibrium and, because of the high mobility of electrons, it is a negative potential of around several volts. The substrate surface potential Vs is lower than the floating potential Vf at the point when the pulses are turned off, and it rises until the incidence of ions and electrons reaches equilibrium. Subsequently, when the next pulse is turned on, the substrate surface potential Vs repeats the same changes.

Figure 3:
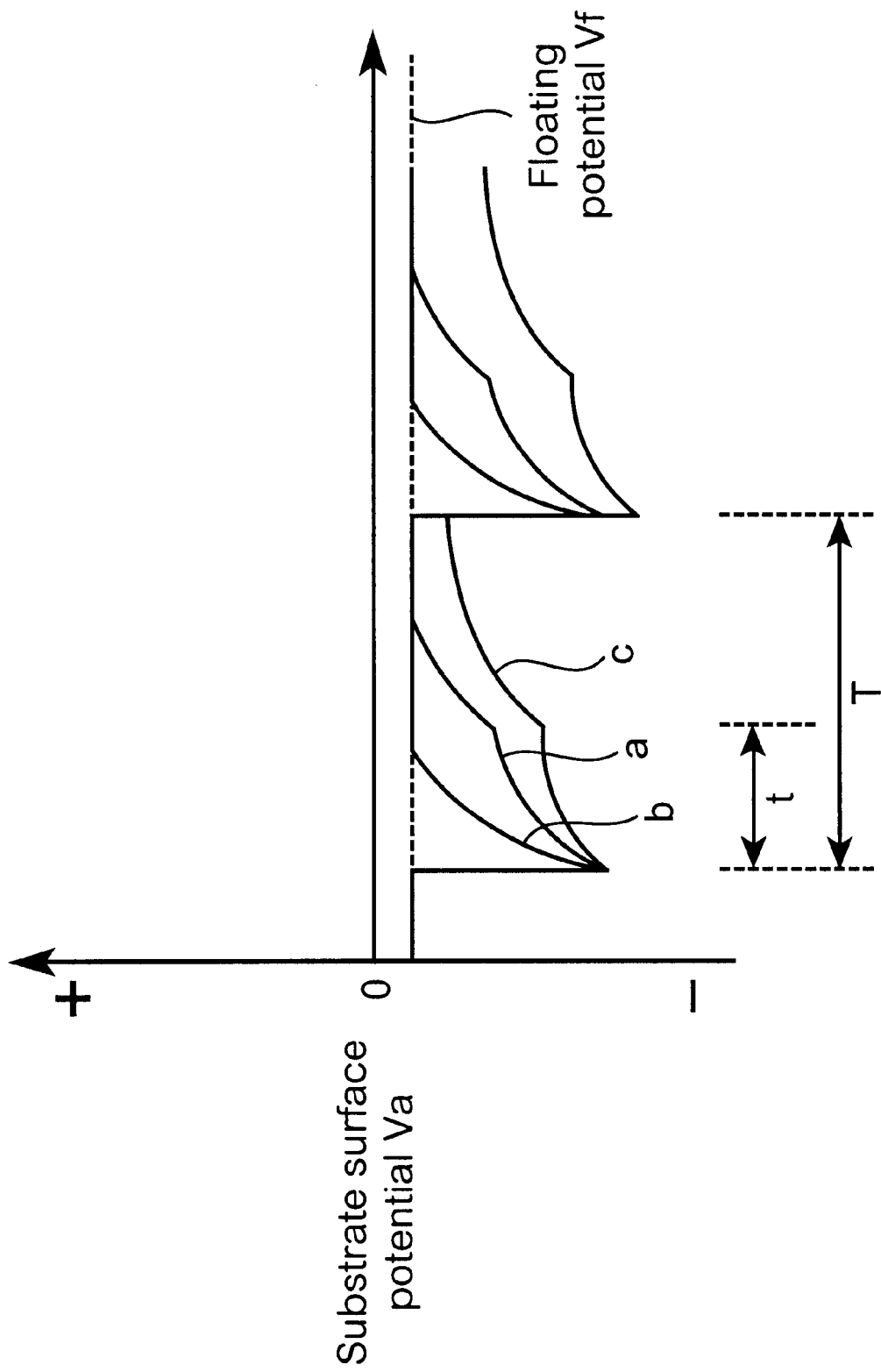
FIG. 3 illustrates the substrate surface potential Vs rise pattern.

Another point in the selection of the pulse period T, pulse width t and pulse height h is that values are preferably set such that the substrate surface potential Vs rises to the floating potential Vf by the time one pulse period T ends. FIG. 3 will be used to describe this point. FIG. 3 is a drawing for describing substrate surface potential Vs rise patterns.

Three substrate surface potential Vs rise patterns are drawn in FIG. 3. Pattern a is the pattern described above and is one in which Vs reaches Vf after the lapse of a period of time equal to a pulse width t, but before a pulse period T ends. Pattern b is a rise pattern in which Vf is reached within the time of a pulse width t. Pattern c is a rise pattern in which Vf fails to be reached by the end of the period T.

In the case of pattern c, since the next pulse is imposed on the bias electrode 23 before there is a rise to the floating potential Vf, the amount of residual charge on the surfaces of the substrate 9 and the dielectric block 22 increases as time elapses. That is, the amount of residual charge on the surfaces of the substrate 9 and dielectric block 22 increases each time a pulse is imposed.

If the amount of residual charge increases more than a certain amount, arc discharge across the surfaces of parts of the processing chamber 1, etc. which are at ground potential may occur, or insulation breakdown of the dielectric block 22 may be caused, so resulting in the flow of leakage current in the holder main body 21. Arc discharge can be the cause of damage to elements inside the processing chamber 1 or the release of material which fouls the substrate 9. Insulation breakdown of the dielectric block 22 leads to damage of the dielectric block and causes a shortening of its life. What is more serious is that, if the amount of residual charge on the surface of the substrate 9 becomes large, it can cause insulation breakdown of an insulation film that is formed inside the substrate or on the surface of the substrate 9, so resulting in a major circuit defect.

In view of the above, pattern a or pattern b is preferable for the rise of the substrate surface potential Vs. Which pattern will result depends on the plasma density, since the substrate surface potential Vs rise occurs as a result of relaxation of the surface charge resulting from incidence of ions. The plasma density is determined by conditions such as the pressure inside the processing chamber 1 and the sputter power supply 5 output, etc. Since these conditions are determined with reference to the required film deposition rate, the pulse period T, pulse width t and pulse height h are set such that pattern a or pattern b results in these conditions.

Specifically, sputtering is effected in the same conditions as in actual film deposition but using a dummy substrate, and changes in the substrate surface potential Vs are measured. Then, the range in which the substrate surface potential Vs rises to about the floating potential Vf at the end of a pulse period T is investigated, and the pulse period T, pulse width t and pulse height h are set in this range.

Figure 4:
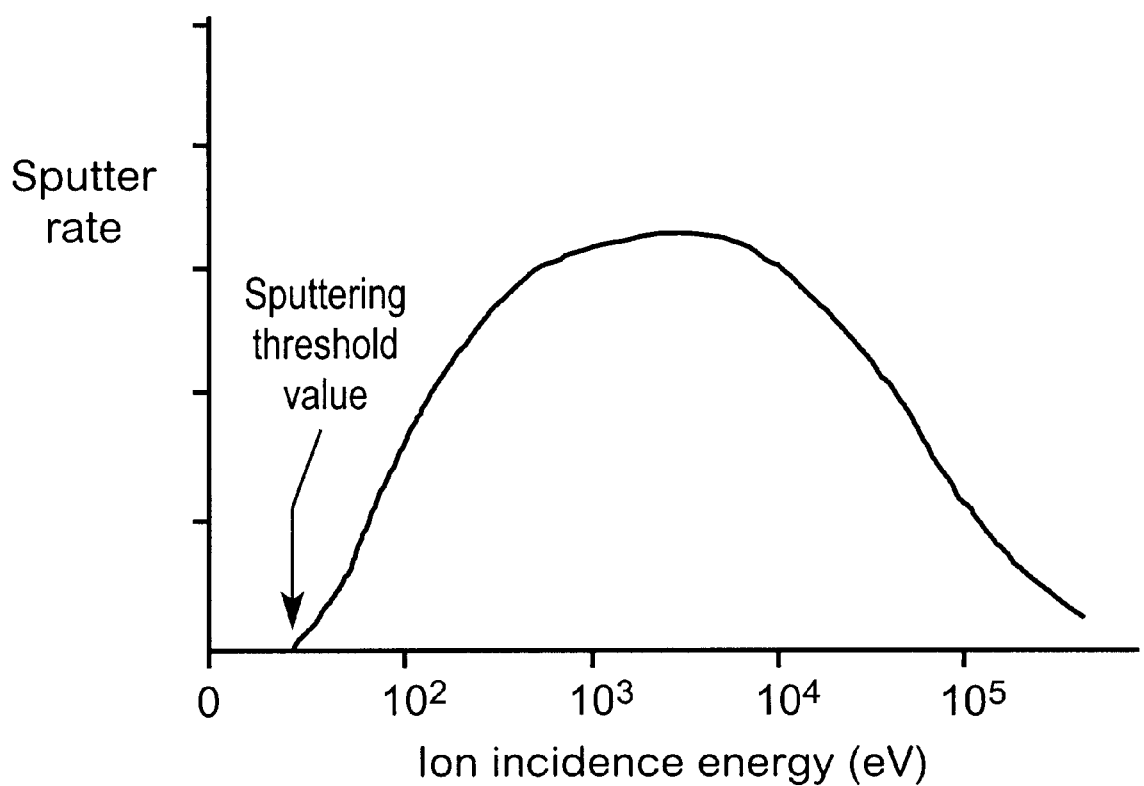
FIG. 4 illustrates the sputtering threshold value.

Another point in the selection of the pulse period T, pulse width t, and pulse height h is that these are preferably determined in relation to a sputtering threshold value for a thin film that is produced. FIG. 2 to FIG. 4 will be used to give a description in relation to this point. FIG. 4 is a drawing for describing a sputtering threshold value.

FIG. 4 plots the sputtering rate against the energy of ions incident on a certain solid surface, and has ion incidence energy (eV) on the abscissa and the sputtering rate (the ratio of the number of sputter atoms ejected per 1 incident ion) on the ordinate. As seen in FIG. 4, sputter atoms are not ejected and sputtering does not occur unless the ion incident energy is above a certain value, known as the threshold value. In the case of titanium, for example, the threshold value is about 20 eV. If the ion incident energy becomes higher than a certain limit, the sputtering rate falls, and this indicates a phenomenon (implantation) in which ions penetrate into the interior of the solid.

As described earlier, the incidence of ions on the substrate 9 takes place through a sheath field between the plasma P and the substrate 9. The plasma space potential Vp is a positive potential of about 0 to several volts. In FIG. 2(2), the plasma space potential Vp is indicated by a dashed line. It is noted that, since the plasma space potential Vp and the substrate surface potential Vs are subject to the effect of a high-frequency field which is established by the sputter power supply 5, they in fact contain high-frequency components, but these can be similarly ignored, since their frequency, at 13.56 MHz, is considerably higher than the ion oscillation frequency.

Ions are accelerated and caused to be incident on the surface of the substrate 9 whose potential varies in the manner shown in FIG. 2(2) by a sheath field which results from the difference between the plasma space potential Vp and the substrate surface potential Vs. While the ion incident energy is low, it does not succeed in sputtering the surface of the substrate 9, but when it gets to above the sputtering threshold value, the result is that sputtering of the surface of the substrate 9 takes place. The sheath field which brings about incidence with the energy of the sputtering threshold value at this time is designated as the threshold field Eth.

In FIG. 2(2), the plasma space potential Vp can be regarded as being constant, and, therefore, the strength of the sheath field is determined by the substrate surface potential Vs. In this case, the substrate surface potential when a threshold value field Eth is reached is designated as the threshold potential Vsth. The pulse period T, pulse width t and pulse height h of the electrode imposed voltage Ve are set such that the substrate surface potential Vs temporarily becomes low and crosses the threshold potential Vsth in the time of one pulse period T of the electrode imposed voltage Ve.

Figure 10:
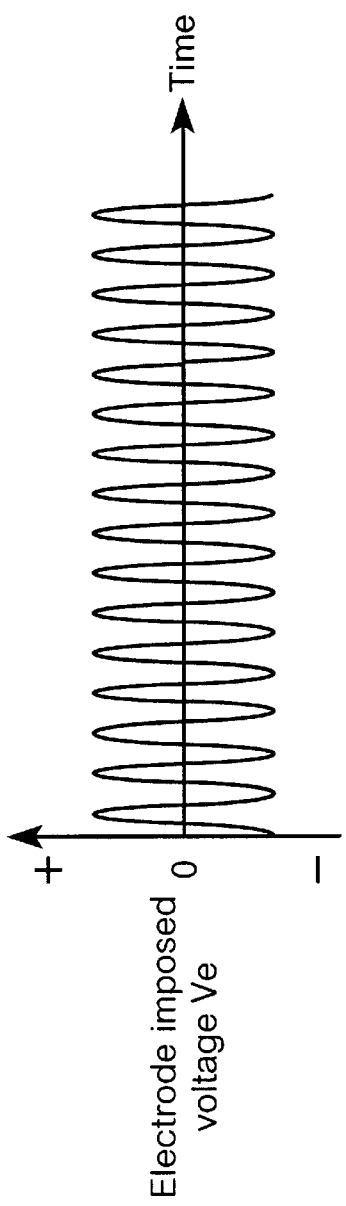
FIGS. 10(1) and 10(2) illustrate the surface potential of a substrate 9 in a conventional method and apparatus.
Figure 10:
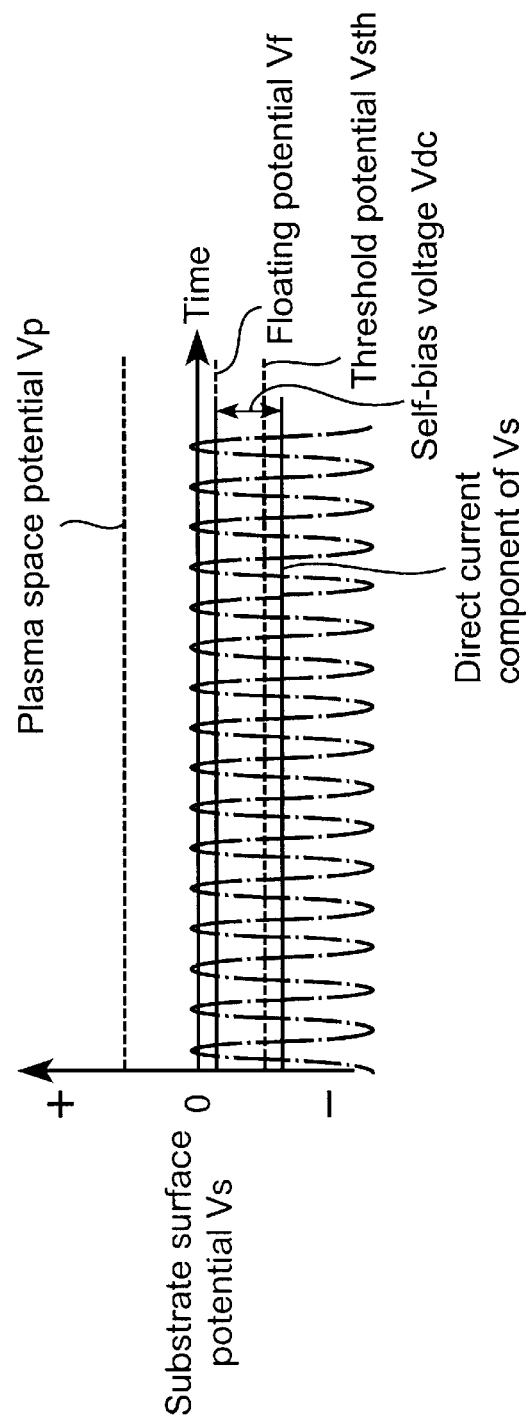

A description of the effect had by bringing about this change in the substrate surface potential Vs will be given together with a comparison with the conventional situation. A threshold potential Vsth is indicated in FIG. 10(2), as in FIG. 2(2). In the conventional case, as seen in FIG. 10(2), the substrate surface potential Vs is always low and crosses the threshold potential Vsth. Therefore, ions whose energy is above the sputtering threshold value always strike the surface of the substrate 9, and resputtering of a thin film always takes place, continuously as time elapses. Because of this, even if the substrate surface potential Vs goes only slightly beyond the threshold potential Vsth, the time-integrated resputtering quantity becomes large. As a result, there is likely to be a problem of a fall in the film deposition rate because of excessive resputtering and a problem of admixture of ions in the thin film.

In the conventional case, it is possible to adjust the self-bias voltage Vdc by adjusting the output of the sputter power supply 5 or a high-frequency power supply provided as the bias electrode 61, and thereby control the amount of resputtering. However, as may be appreciated from FIG. 10(2), in the conventional case, there are essentially only two choices, which are (1) that resputtering should always occur continuously as time elapses or (2) that resputtering should not occur at all. Because of this, it is extremely difficult to effect control such as to achieve an optimum resputtering quantity (or resputtering rate).

In contrast, in FIG. 2(2), the lowering of the substrate surface potential Vs to below the threshold potential Vsth is limited to a transitory time band in one pulse period T. This is a natural result, since the threshold potential Vsth is lower than the floating potential Vf, and, as described above, Vs recovers to Vf before the end of the pulse period T. The fact that Vs becomes lower than Vsth temporarily in the pulse period T means that sputtering of the substrate 9 by incident ions takes place intermittently. This is a major point of difference from the prior art.

The time band in which sputtering of the substrate 9 takes place in one pulse T, i.e., the time band (indicated by ts in FIG. 2(2)) in which the substrate surface potential Vs is lower than the threshold potential Vsth depends on the value at which pulse input is turned on and the substrate surface potential Vs is initially reached (and which is referred to below as the pulse initial potential Vso), on the rate at which the substrate surface potential Vs, having been relaxed by the incidence of ions, rises and on the pulse width t. The rate at which the substrate surface potential Vs rises depends on the plasma density, and the plasma density depends on the pressure and the sputter power supply 5 output, etc. Assuming that these are constant, the time band ts is determined by the magnitude of the pulse initial potential Vso and the pulse width t.

The pulse initial potential Vso is determined by the pulse height of the electrode imposed voltage Ve and the permittivity $\epsilon$ and the shape dimensions of the dielectric block 22.

Since the permittivity ε and the shape dimensions of the dielectric block 22 are constant, the length of the time band ts can, ultimately, be controlled by the pulse height h and pulse width t.

The pulse height h and pulse width t are set by conducting film deposition tests in the same conditions as in actual film deposition, as in the manner described above, and determining the pulse height h and pulse width t with which set values of the film deposition rate and film deposition characteristics such as the bottom coverage, etc. are achieved. As described earlier, all that is needed to increase the coverage of the inner surface of a hole with a high aspect ratio is to make the amount of overhang that is resputtered large. All that is needed for this is to make ts indicated in FIG. 2(2) long. When ts is made longer, the time for which the substrate surface potential Vs is lower than the threshold potential Vsth becomes longer, and the time-integrated resputtering quantity increases.

However, when the amount of resputtering is large, the overall film deposition rate falls, as noted earlier. Taking this into account, the pulse height h and pulse width t which give optimum results both in terms of hole inner surface coverage and in terms of the film deposition rate are determined and set experimentally. At all events, the control is not control in which, as in the past, only one of two choices, whether to have resputtering occur constantly or not all, is made, but since resputtering occurs intermittently and the temporal width of resputtering in each period can be controlled, values which give optimum results can easily be selected.

A summary relating to the above-noted pulse period T, pulse width t, and pulse height h will now be given.

(1) The pulse period T is preferably set such that the frequency of pulses is lower than the ion oscillation frequency.

(2) The pulse period T, pulse width t, and pulse height h are preferably set such that the substrate surface potential Vs recovers to about the same level as the floating potential Vf by the end of a pulse period T.

(3) The pulse width t and pulse height h are preferably set in a manner to give optimum results both in respect of hole coverage and in respect of the film deposition rate.

The pulse period T, pulse width t, and pulse height h which have been set in the above manner are input into the control section 62 from the input section 65 and stored in a memory not shown which is in the control section 62. Then, pulse height h data are sent to the direct-current power supply circuit 63 from the pulse height control circuit 621, and the output voltage of the direct-current power supply circuit 63 is controlled in such a manner that it matches these data. Also, the pulse period T and pulse width t data are sent to the pulse generation circuit 64 from the pulse generation control circuit 622, and the output pulses of the pulse generation circuit 64 are controlled in such a manner that they match these data.

Next, the rest of the structure of the thin film fabrication apparatus of this embodiment will be described.

The apparatus of this embodiment is constituted as an apparatus for producing a barrier film. Therefore, the target 41 is made of titanium or tantalum, etc. In some cases, the gas delivery system 3 is constructed such that nitrogen can be introduced as well as argon. When sputtering is effected while introducing nitrogen, a reaction between the nitrogen and the material of the target 41 takes place, and titanium nitride or tantalum nitride can be produced as a barrier film.

Further, a magnet unit 42 is provided at the rear of the target 41 (at the side opposite to the sputtered surface). The magnet unit 42 is an element which constitutes the cathode 4 together with the target 41. The magnet unit 42 is provided in order to make it possible to effect magnetron sputtering. Magnetron sputtering is a procedure in which a magnetic field which is normal to a set electric field is established via the target 41, and highly efficient discharge is achieved by effecting magnetron displacement of electrons. This highly efficient discharge offers the advantages that films can be deposited at a high film deposition rate even at a comparatively low pressure and that high-quality thin films can be produced at high productivity.

The magnet unit 42 comprises a core magnet 421 which is provided in the center, a right-shaped peripheral magnet 422 which surrounds the core magnet, and a yoke 423 which connects the core magnet 421 and peripheral magnet 422. Lines of magnetic force 424 which pass through the target 41 and extend in a manner shown in FIG. 1 are established between the core magnet 421 and peripheral magnet 422. These lines of magnetic force 424 are at right-angles to the electric field (lines of electric force) in the vicinity of their extension vertices, etc., and make it possible to effect magnetron sputtering.

Further, a heating system 24 which heats the substrate 9 to a set temperature is provided in the holder main body 21 of the substrate holder 2. The heating system 24 heats the substrate 9 to about 100–500 C, in order to increase the film deposition rate. A Joule heat generation type system can, for example, be used as the heating system 24.

For the purpose of, for example, improving the contact between the substrate holder 2 and the substrate 9 and improving the heating efficiency, etc., it is preferable that the substrate 9 be held electrostatically by the substrate holder 2. In the apparatus of this embodiment, it is possible for static electricity to be induced at the surface of the dielectric block 22 by the above-noted electrode imposed voltage Ve and for the substrate 9 to be electrostatically clamped by this static electricity.

Further, an adhesion prevention shield 71 is provided in the space between the target 41 and the substrate 9. This adhesion prevention shield 71 is for the purpose of preventing adhesion of sputter particles on the inner surface of the processing chamber 1. Also, a ring shield 72 is installed in a manner such that it is positioned around the substrate 9 held by the substrate holder 2. The ring shield 72 is for the purpose of preventing diffusion of the plasma to unwanted locations and adhesion of sputter particles on unwanted locations.

Next, a description of the operation of the apparatus of this embodiment constituted in the manner described above will be given together with a description of the method of this embodiment.

First, the substrate 9 is carried into the processing chamber 1 via a gate valve (not shown) by a transfer robot (not shown), and is held at a set location of the outer surface of the substrate holder 2 (specifically, the outer surface of the dielectric block 22). Then, the gate valve (not shown) is closed and, after confirmation that the interior of the processing chamber 1 has been pumped out to a set pressure by an evacuation system 11, the gas delivery system 3 is actuated and a set process gas is introduced at a set flow rate into the processing chamber 1. The heating system 24 in the substrate holder 2 preheats the substrate 9 to a set temperature.

In this state, the sputter power supply 5 is actuated, sputter discharge occurs, the target 41 is sputtered, and a plasma P is produced. At the same time, the bias system 6 is actuated, and an electrode imposed voltage Ve with a pulse form such as described above is imposed on the bias electrode 23. Sputter particles which have been ejected from the target 41 as the result of sputter discharge reach the substrate 9, and a thin film is deposited.

In this process, sputter particles which are ejected from the target 41 as a result of the sputter discharge are ionized in the plasma P and become ionized sputter particles. The ionized sputter particles are accelerated by the sheath field, and most of them are incident perpendicularly to the substrate 9. As a result, the coverage of the inner surface of a fine hole is improved. Further, the pulse period T, pulse width t, and pulse height h of the electrode imposed voltage Ve which is imposed on the bias electrode 23 are controlled in the manner described above.

After film deposition has been effected for a set time in this manner, the operation of the sputter power supply 5, bias system 6 and heating system 24 is stopped. After that, the interior of the processing chamber 1 is pumped out again, and the substrate 9 is taken out from the processing chamber 1 by the transfer robot (not shown).

In the method and apparatus of this embodiment with the above structure and operation, since the surface of the substrate 9 is biased by imposing a voltage in pulse form on the bias electrode 23 and, in addition, the pulse period T, pulse width t, and pulse height h are controlled in the manner described above, a fall in the film deposition rate due to excessive resputtering and problems such as that of an increase in the accumulated substrate 9 surface charge, etc., are suppressed.

The structure whereby the substrate 9 is biased not by imposing a high-frequency voltage as in the past but by imposing a voltage in pulse form is very suitable, in that it permits control and adjustment to be effected without disordering the state of the plasma. Imposition of a high-frequency voltage with a frequency of about 13.56 MHz as in the past results in excitation of a high-frequency plasma and acts to increase the plasma density in the vicinity of the surface of the substrate 9. In this case, if action such as adjusting the output or the frequency of the high frequency is taken in order to adjust the substrate surface potential Vs, the plasma density in the vicinity of the surface of the substrate 9 changes considerably. In contrast, when, as in this embodiment, a voltage which is in pulse form and whose frequency is lower than the ion oscillation frequency is imposed, there is only a slight action whereby the plasma in the vicinity of the surface of the substrate 9 is excited, and so there are no problems of deterioration of reproducibility, even if the pulse width, etc. is adjusted in the manner described above.

Next, a second embodiment of the method and apparatus of the present invention will be described.

Figure 5:
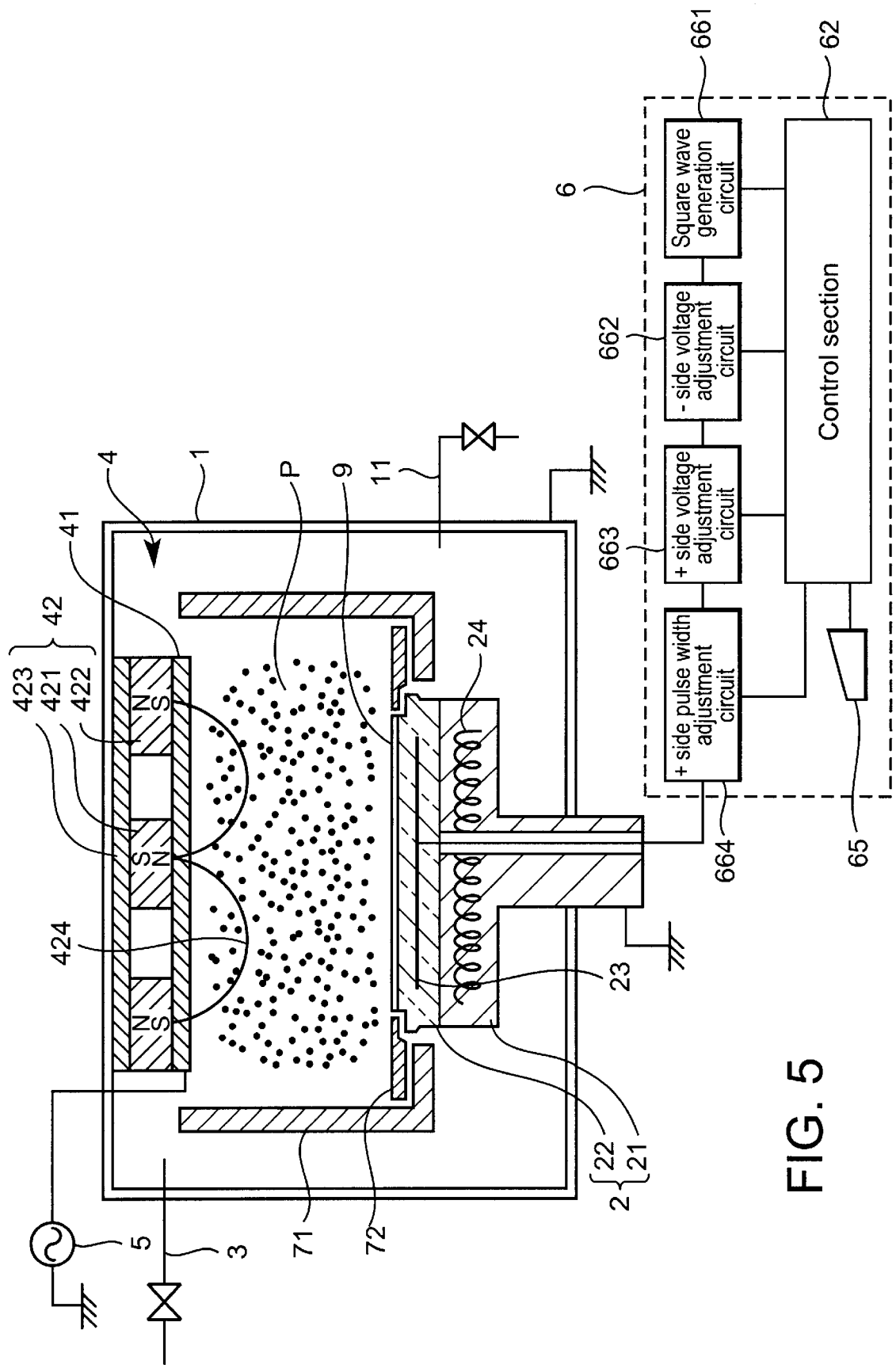
FIG. 5 is a front view which shows the outline structure of a thin film fabrication apparatus of a second embodiment of the present invention.

FIG. 5 is a front view which schematically shows the structure of the thin film fabrication apparatus of the second embodiment of the present invention. The apparatus of this embodiment differs from that of the first embodiment only in respect of the structure of the bias system 6. The bias system 6 of the second embodiment is constructed such that a voltage in pulse form with a waveform which includes a pulse for relaxation in addition to a pulse for ion incidence can be imposed on the bias electrode 23.

More specifically, the bias system 6 comprises a square wave generation circuit 661, which produces square waves of a set period and width from commercial alternating current, a − side voltage adjustment circuit 662, which adjusts the − side output voltage within the output of the square wave generation circuit 661, a + side voltage adjustment circuit 663 which adjusts the + side output voltage within the output of the square wave generation circuit 661, a + side pulse width adjustment circuit which adjusts the + side pulse width, a control section 62, which controls the square wave generation circuit 661, − side voltage adjustment circuit 662, + side voltage adjustment circuit 663 and + side pulse width adjustment circuit 664, and an input section 65 which inputs control signals to the control section 62. The bias electrode 23 is similarly provided in the dielectric block 22, and the output voltage of the bias system 6 is similarly imposed on the bias electrode 23.

A structure in which commercial alternating current input is converted to alternating current with a set frequency and square waves with a set period and width are produced from this alternating current by a Schmidt trigger circuit can, for example, be used for the square wave generation circuit 661. The control section 62 can control the square wave period by controlling the frequency of the alternating current and can control the square wave width by controlling the direct-current component of the alternating current.

The + side voltage adjustment circuit 663 and − side voltage adjustment circuit 662 can be constituted by limiter circuits using Zener diodes etc., and they are each independently controlled by the control section 62. A circuit which cuts off the + side pulse width by means of a switching circuit can be used for the + side pulse width adjustment circuit 664. The control section 62 controls a trigger circuit which sends trigger signals to the switching circuit, and it can control the + side pulse width to any required value.

Figure 6:
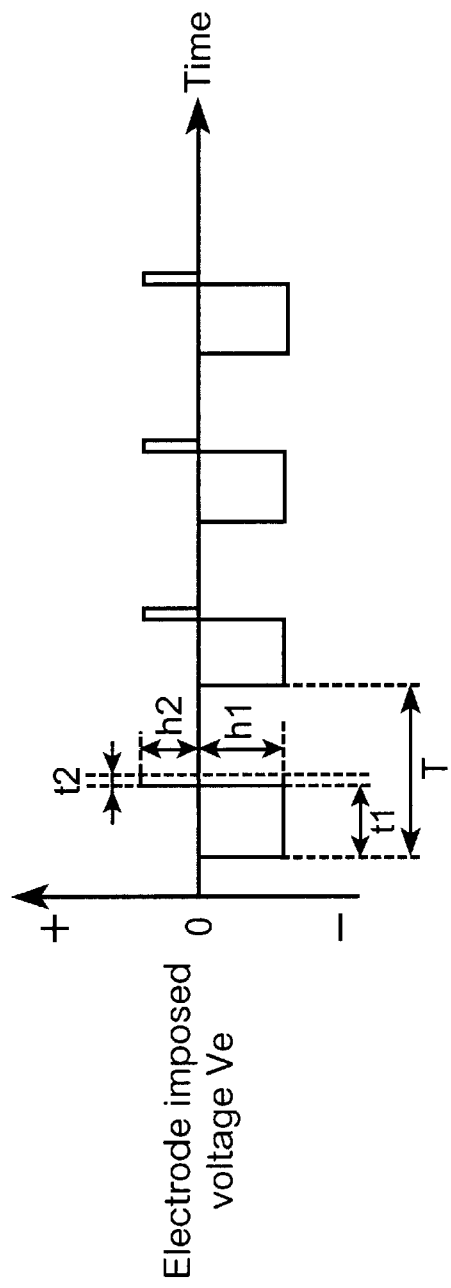
FIGS. 6(1) and 6(2) illustrates changes in the substrate surface potential which are brought about by the actions of a plasma and the electrode imposition voltage which is supplied to the bias electrode 23 by the bias system 6 shown in FIG. 5.
Figure 6:
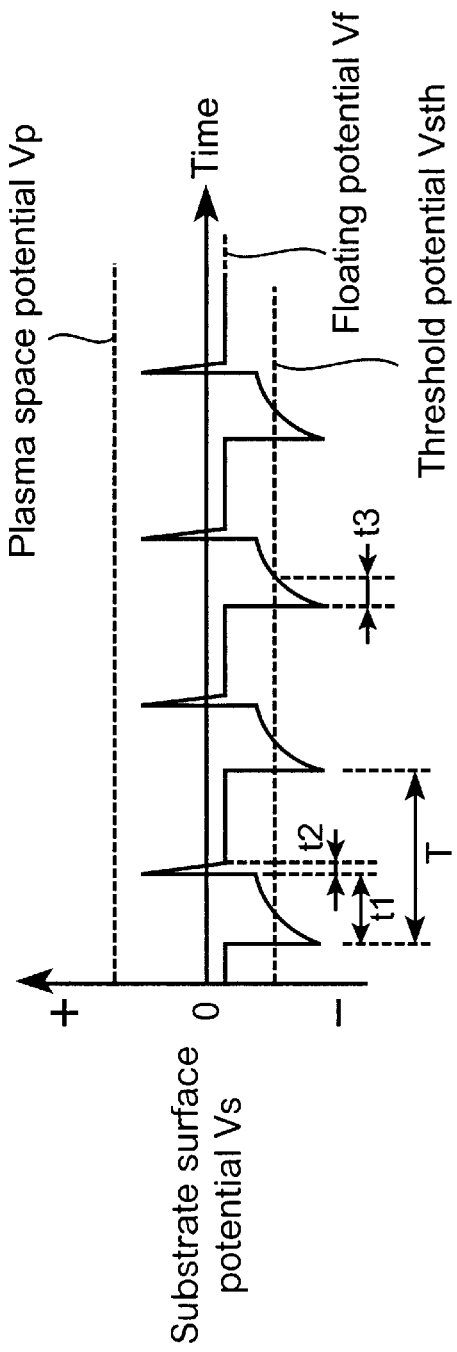

FIG. 6 will be used to give a description relating to the structure of the control section 62 shown in FIG. 5. In FIG. 6, which is a drawing for describing changes in the substrate surface potential which occur as the result of the actions of the plasma and the electrode imposed voltage which is imposed on the bias electrode 23 by the bias system 6 shown in FIG. 5, FIG. 6(1) indicates the electrode imposed voltage Ve and FIG. 6(2) indicates the substrate surface potential Vs.

As shown in FIG. 6(1), the electrode imposed voltage Ve consists of square wave pulses which swing positively and negatively from ground potential. The period of these pulses will be designated as T, the − side pulse width as t1, the + side pulse width as t2, the − side pulse height as hi, and the + side pulse height as h2. The arrangement is made such that these T, t1, t2, h1 and h2 data can be input from the input section 65 shown in FIG. 1. The control section 62 sends control signals to the square wave generation circuit 661, − side voltage adjustment circuit 662, + side voltage adjustment circuit 663 and + side pulse width adjustment circuit 664 in accordance with the values which are input from the input section 65, and effects control to make the pulse width T, − side pulse width t1, + side pulse width t2, − side pulse height h1 and + side pulse height h2 match the values which have been input.

The T, t1, t2, h1 and h2 data input by the input section 65 are similarly set beforehand in a manner such as to achieve optimum film deposition on the surface of the substrate 9.

Further, the T, t1, t2, h1 and h2 data are set such that the substrate surface potential Vs recovers to the floating potential Vf at the end of a pulse period T. This structure differs from the first embodiment in that + side pulses are imposed as pulses for relaxation. This point is described below.

When square wave pulses with the shape shown in FIG. 6(1) are imposed on the bias electrode 23, the substrate surface potential Vs varies in the manner shown in FIG. 6(2). In more detail, the start of imposition of a − side pulse causes an instantaneous fall in the substrate surface potential Vs. Then, the charge on the surface of the substrate 9 is relaxed as the result of incidence of ions in the plasma, and Vs gradually rises. Then, when the time of the – side pulse width t1 passes and a + side pulse is imposed, the substrate surface potential Vs instantaneously rises, as shown in FIG. 6(2). When the substrate surface potential Vs becomes positive, electrons in the plasma immediately gather on the surface of the substrate 9. Since the mobility of electrons is far greater than that of ions, the surface charge of the substrate 9 is relaxed in a short time, and the substrate surface potential Vs falls to the floating potential Vf in a short time. Subsequently, as the time of the pulse period T elapses, Vs repeats the same changes.

In this embodiment, the electrode imposed voltage Ve is set such that the substrate surface potential Vs temporarily becomes low and crosses the threshold potential Vsth in the time of one pulse period T, as indicated in FIG. 6(2). Further, control is effected in a manner such that the length of the time band ts in which the substrate surface potential Vs is beyond the threshold potential Vsth is made optimum. In this second embodiment, as may be appreciated from the description above, the imposition of a + side pulse at the time when imposition of a – side pulse in the process ends makes it possible to cause the substrate surface potential Vs to settle at the floating potential Vf in a short time. Further, there is a high degree of freedom, since setting of the t1 and h1 data can be made practically irrespective of the condition (1) that 'there is recovery to the floating potential Vf at the end of a pulse period T'. It is noted that a + side pulse need not be supplied immediately following the end of imposition of a – side pulse but it may be supplied with the interposition of a certain period of time.

With the apparatus of this second embodiment, a fall in the film deposition rate due to excessive resputtering and problems such as that of an increase in the accumulated substrate 9 surface charge, etc. are suppressed. It is noted that the + side pulse width t2 constitutes a portion in the time band (T–t1) in which a – side pulse is not imposed, and there is a time band in which neither a + side pulse nor a – side pulse is imposed. This has the technological significance that it prevents the problem of excessive accumulation of charges of opposite polarity (electrons) that would arise if a + side pulse constituting a pulse for relaxation were imposed throughout the time band T–t1, since in this case there would be over-relaxation of the charge.

Next, a description relating to a third embodiment of the present invention will be given.

Figure 7:
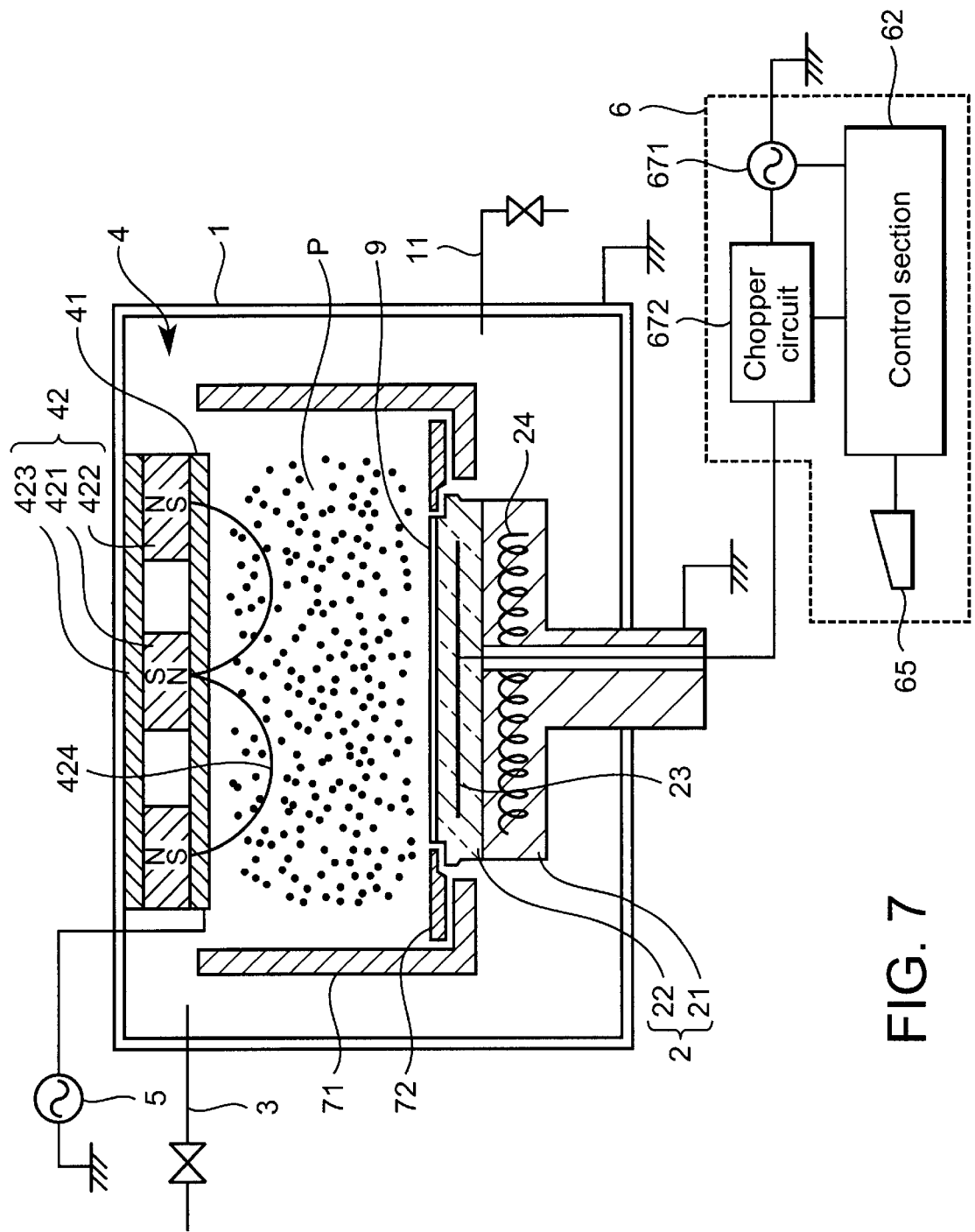
FIG. 7 is a front view which shows the outline structure of the thin film fabrication apparatus of a third embodiment of the invention of the present Application.
Figure 9:
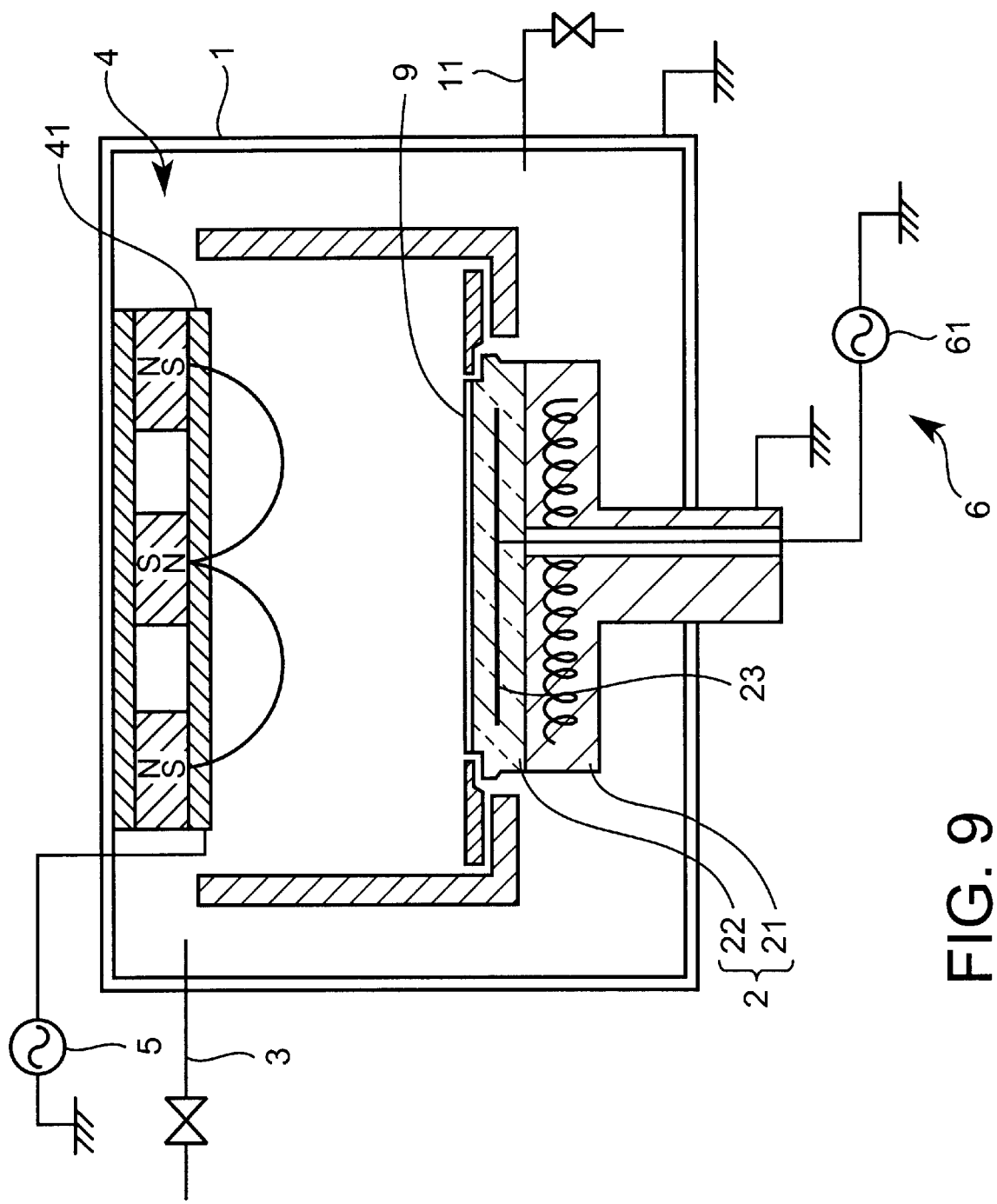
FIG. 9 is a front view which shows the outline structure of an ionization sputtering apparatus which is an example of a conventional thin film fabrication apparatus.

FIG. 7 is a front view which schematically shows the structure of the thin film fabrication apparatus of the third embodiment. This third embodiment differs from the first embodiment only in respect of the structure of the bias system 6. The bias system 6 in the third embodiment is so constituted that cut-off pulses produced by chopping an alternating current of a set frequency are imposed on the bias electrode 23. The alternating current used in this form of implementation is a high-frequency current whose frequency is lower than the oscillation frequency of ions.

More specifically, the bias system 6 comprises a high-frequency power supply 671 whose output frequency can be varied, a chopper circuit 672, which chops the output of the high-frequency power supply 671 in a set pattern, a control section 62, which controls a modulation circuit and the chopper circuit 672, and an input section 65, which inputs control signals into the control section 62. A circuit employing a thyristor or similar control element can be used as the chopper circuit 672. A matching unit not shown is provided between the high-frequency power supply 671 and the bias electrode FIG. 8 will be used to give a description relating to the structure of the control section 62 shown in FIG. 7. In FIG. 8, which is a drawing for describing changes in the substrate surface potential which occur as the result of the actions of a plasma and the electrode imposed voltage which is imposed on the bias electrode 23 by the bias system 6, FIG. 8(1) indicates the electrode imposed voltage Ve, and FIG. 8(2) indicates the changes in the substrate surface potential Vs.

The control section 62 controls the high-frequency power supply circuit 671 and the chopper circuit 672 in accordance with the data which are input from the input section 65, and it is constructed such that cut-off pulses such as shown in FIG. 8(1) are imposed on the bias electrode 23.

Similarly to what was described earlier, the data of the effective value A (or amplitude) of the high-frequency voltage which constitutes the source of the cut-off pulses, the – side pulse width h1 and the + side pulse width t2 are set such that the substrate surface potential Vs returns to the floating potential Vf at the end of a pulse period T. This aspect will now be described.

When cut-off pulses with the shape shown in FIG. 8(1) are imposed on the bias electrode 23, the substrate surface potential Vs varies in the manner shown in FIG. 8(2). In more detail, when imposition of a – side pulse is started, the substrate surface potential Vs, like the electrode imposed voltage Ve, falls. Then, when imposition of the – side pulse ends and the electrode imposed voltage Ve becomes 0V, the charge is moderated by the incidence of ions, and Vs gradually rises. Then, when a half-period elapses and imposition of a + side pulse is started, Vs crosses the ground potential and shifts to the + side, but, since highly mobile electrons immediately gather, Vs settles at the floating potential Vf in a short time. Subsequently, when the time of one pulse period T elapses and the cut-off pulse of the next period is imposed, the same changes are repeated.

In this embodiment, the electrode imposed voltage Ve is set such that, in the time of the pulse period T, the substrate surface potential Vs temporarily crosses the threshold potential Vsth, as indicated in FIG. 8(2). Further, control is effected in a manner such that the length of the time band ts in which the substrate surface potential Vs is made optimum. In the third embodiment, since a + side pulse is imposed after the end of – side pulse imposition, it is possible to cause the substrate surface potential Vs to settle at the floating potential Vf in a short time. Further, there is a high degree of freedom, since the setting of the – side pulse width t1 and effective value A data can be made practically irrespective of the condition (1) that there is recovery to the floating potential Vf at the end of a pulse period T. Also, similarly to what was described earlier, since the frequency of the cut-off pulses is low, there is only a slight effect whereby the plasma in the vicinity of the surface of the substrate 9 is excited, and no problem of deterioration of the reproducibility due to adjustments occurs. It is noted that care is needed, since, as described earlier, excessive accumulation of charges of opposite polarity (electrons) takes place if the + side pulse width t2 is long.

EXAMPLES

Next, the following can be cited as examples of implementation associated with the embodiments described above.

First, as an example of implementation associated with the first embodiment, the structure can be made such that an electrode imposed voltage Ve such as follows is imposed.

Pulse frequency: 5 KHz–3 MHz
Pulse period T: 0.3° seconds–200° seconds

Pulse width: 10–90% of pulse period T

Pulse heighth: 10–500V

By way of an example of implementation of the second embodiment, the structure can be made such that an electrode imposed voltage Ve such as follows is imposed.

Pulse frequency. 5 KHz–3 MHz

Pulse period T: $0.3\mu$ seconds–200° seconds

− side pulse width t1: 20–90% of pulse period T

− side pulse height h1: 10–500V

+ side pulse width t2: 5–10% of pulse period T

+ side pulse height h2: 10–100V

By way of an example of implementation of the third embodiment, the structure can be made such that an electrode imposed voltage Ve such as follows is imposed.

Pulse frequency: 5 KHz–3 MHz

Pulse period T: $0.3\mu$ seconds–200° seconds

− side pulse width t1: 10–100% of half period

+ side pulse width t2: 5–10% of half period

Voltage effective value A of high-frequency power supply 671: 10–500V

Conditions such as follows can be cited as film deposition conditions which are common to the above examples.

Pressure: several mtorr–100 mtorr

Process gas and flow rate: Ar, 10–100 cc/minute

Sputter power supply 5: 13.56 MHz, output 1 kW–20 kW

Target 41: Titanium

When film deposition is effected in conditions such as these, excellent results for practical purposes are achieved, the bottom coverage ratio (the ratio of the rate of hole bottom surface film deposition to that on surfaces other than the hole) for holes with an aspect ratio of about 6 being 30–40%, and the overall film deposition rate being about 300–500 angstroms/minute.

Although, in the various embodiments and examples of implementation described above, descriptions were given assuming that the electrode imposed voltage Ve is imposed in a manner such that the substrate surface potential Vs temporarily crosses the threshold potential Vsth in one pulse period T. This is not a necessary condition, and the arrangement may also be that Ve is imposed in a range in which Vs does not cross Vsth. In this case, there is essentially no occurrence of thin film resputtering by ions of the process gas, and it is possible to achieve a separate advantage that the rate of film deposition by ion bombardment is increased. For example, in cases in which overhang deposition on the edge of a hole opening is not observed and resputtering is not necessary, ions are caused to be incident at optimum energy in a range in which resputtering does not occur. As a result of this, it is possible to deposit a film at a high film deposition rate using the energy of incident ions for film growth and to achieve high productivity.

Further, although it was taken that the bias system 6 imposes a voltage in pulse form on the bias electrode 23, and the voltage in pulse form is supplied indirectly via the dielectric block 22, the arrangement may also be that the voltage in pulse form is imposed directly on the substrate 9. In this case, if an insulating film (e.g. silicon oxide) is formed beforehand on the surface of the substrate 9, and an electrically conductive film of titanium, etc. is deposited on top of that, the variation of the surface of the substrate potential is generally equivalent to that shown in FIG. 2(2), FIG. 6(2) or FIG. 8 (2).

However, it is not very desirable to impose a voltage directly on the substrate 9, since, if this is done, electrons and ions flow continuously from the plasma to the bias system 6 side. There are in fact cases in which cut-off is effected if an insulating film is formed on the substrate 9, but such cases are still undesirable, since, if insulation breakdown of the insulating film occurs because there is a large current, there is a considerable risk that this will lead to a circuit defect. In this sense, the most suitable structure is one in which a voltage in pulse form is imposed indirectly on the substrate 9 via a dielectric.

The various parameters of the electrode imposed voltage Ve are determined experimentally beforehand, as noted above, and if the content of film deposition is different, these data are suitably altered and input via the input section 65.

Further, although, in the examples and embodiments described above, it was assumed that actions are caused to be incident and, therefore, the pulses for ion incidence were negative-voltage pulses and the pulses for relaxation were positive-voltage pulses, it is possible to have a situation which, exceptionally, is opposite to this. A situation corresponding to this would be one in which anions are present in the plasma and anions are caused to be incident on the surface of the substrate 9.

Further, although the case of ionized sputter particles was considered in the description above, the structure of the present invention is effective in all techniques in which films are deposited while imposing a bias on a substrate 9 in order to bring about incidence, and it can also be applied to, for example, CVD, etc. For example, in a case in which a reactive gas is introduced into a processing chamber and a film is deposited by plasma CVD, the structure of the present invention is extremely effective in achieving improvements such as an increase of the film deposition rate, etc. by a procedure in which a precursor (precursor of a reaction by which a thin film is ultimately deposited) gas is ionized and ionized precursors are accelerated by a sheath field end caused to be incident.

It is noted that means which produce a plasma by high-frequency discharge or direct-current diode discharge etc. are sometimes employable as plasma generation means. Also, the substrate 9 is not limited to being a semiconductor wafer, but application is also possible to liquid crystal substrates, etc. in the manufacture of liquid crystal displays. In the case of a liquid crystal substrate, there may be no problems even if a voltage in pulse form is imposed directly, since the substrate itself is made of a dielectric.

As described above, with the method and apparatus of the present invention, since, as well as the substrate surface being biased by imposition of a voltage in pulse form on the substrate, the pulse period, pulse width, and pulse height are controlled, it is possible to effect optimization of the substrate bias such that optimum ion incidence energy and incidence quantity are achieved. Also, there are no problems of deterioration of reproducibility because of variation of the plasma density.

Furthermore, an increase in the amount of substrate residual charge may be suppressed, since pulses for relaxation may be imposed on the substrate, and there is also the advantage that there is an increased degree of freedom in the setting of other parameters.

There is the further advantage that, since there may be a time band in which neither a pulse for ion incidence nor a pulse for relaxation is imposed, it is possible to suppress the problem of an increase in the amount of accumulation of charges of opposite polarity due to over-relaxation.

In addition to the above advantages, since control by which the ion incidence energy is caused to temporarily cross the sputtering threshold value in one pulse period may be effected, problems such as those of a fall in the film deposition rate due to excessive resputtering, admixture of ions in the thin film and an increase in the amount of substrate surface accumulated charge, etc. are suppressed. It is therefore possible to improve the coverage of the inner surfaces of very fine holes but at the same time prevent a fall in productivity. Further, there is provided a good-quality process with which little or no harm is caused to the quality of thin films which are produced or to manufactured device characteristics, etc.

In addition to the above advantages, problems of substrate damage, etc. due to the flow of a large current from the plasma to the substrate are minimized or prevented, since a dielectric may be interposed and a voltage in pulse form may be imposed indirectly on the substrate.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A thin film fabrication method comprising the following steps:

forming a plasma in a space facing a surface of a substrate, biasing said substrate surface relative to a plasma space potential by imposing a voltage in a pulse form on said substrate, a frequency of said voltage in the pulse form is less than an oscillation frequency of ions in said plasma, using the bias to cause a thin film to be produced on said substrate surface as said ions in said plasma are caused to be incident on said substrate surface, setting at least one of a pulse period, a pulse width, and a pulse height of said voltage such that a surface voltage of the substrate reaches a floating potential before the pulse period ends, wherein the floating potential is a potential at which an incidence of ions and electrons on the substrate surface reaches equilibrium.

2. The method according to claim 1, in which a waveform of said voltage in the pulse form contains a first pulse and a second pulse whose polarity is different from that of said first pulse.

3. The method according to claim 2, in which a width of said second pulse is shorter than a time which is a width of said first pulse deducted from said pulse period, and there is a time in the pulse period in which no pulse is imposed.

4. The method according to claim 1, in which said pulse period, said pulse width and said pulse height are controlled in a manner such that, in one pulse period, an incidence energy of said ions temporarily crosses a sputtering threshold value which is a lowest-limit energy value needed to effect sputtering of a thin film which is produced on said substrate surface.

5. The method according to claim 2, in which said pulse period, said pulse width and said pulse height are controlled in a manner such that, in one pulse period, an incidence energy of said ions temporarily crosses a sputtering threshold value which is a lowest-limit energy value needed to effect sputtering of a thin film which is produced on said substrate surface.

6. The method according to claim 3, in which said pulse period, said pulse width and said pulse height are controlled in a manner such that, in one pulse period, an incidence energy of said ions temporarily crosses a sputtering threshold value which is a lowest-limit energy value needed to effect sputtering of a thin film which is produced on said substrate surface.

7. The method according to claim 1, in which said voltage in the pulse form is imposed indirectly on said substrate with an interposition of a dielectric.

8. The method according to claim 2, in which said voltage in the pulse form is imposed indirectly on said substrate with an interposition of a dielectric.

9. The method according to claim 3, in which said voltage in the pulse form is imposed indirectly on said substrate with an interposition of a dielectric.

10. The method according to claim 4, in which said voltage in the pulse form is imposed indirectly on said substrate with an interposition of a dielectric.

11. A thin film fabrication method comprising the following steps:

forming a plasma in a space facing a surface of a substrate, biasing said substrate surface relative to a plasma space potential by imposing a voltage in a pulse form on said substrate, a frequency of said voltage in the pulse form is less than an oscillation frequency of ions in said plasma, using the bias to cause a thin film to be produced on said substrate surface as said ions in said plasma are caused to be incident on said substrate surface, wherein a waveform of said voltage in the pulse form contains in each period a first pulse, a second pulse, and a time in which no pulse is applied, and a polarity of the first pulse is different from a polarity of said second pulse.

12. The method according to claim 11, wherein the first pulse is for ion incidence and the second pulse dissipates a charge of the first pulse.

13. The method according to claim 11, wherein the time in which no pulse is applied is at an end of each period.

14. The method according to claim 11, wherein the time in which no pulse is applied after the second pulse.

* * * * *